(12) United States Patent
Frank et al.

(10) Patent No.: US 6,542,055 B1
(45) Date of Patent: Apr. 1, 2003

(54) INTEGRATED FILTER BALUN

(75) Inventors: Michael L. Frank, Los Gatos, CA (US); John D Larson, III, Palo Alto, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/704,201

(22) Filed: Oct. 31, 2000

(51) Int. Cl.[7] .................................................. H03H 9/58
(52) U.S. Cl. ........................ 333/189; 333/187; 333/190
(58) Field of Search .............................. 333/187, 189, 333/190; 310/320

(56) References Cited

U.S. PATENT DOCUMENTS

| | | | | |
|---|---|---|---|---|
| 4,344,093 A | * | 8/1982 | Huber | 360/45 |
| 5,682,126 A | * | 10/1997 | Plesski et al. | 333/193 |
| 5,789,845 A | * | 8/1998 | Wadaka et al. | 310/334 |
| 5,910,756 A | * | 6/1999 | Ella | 333/133 |
| 6,084,333 A | * | 7/2000 | Inoue et al. | 310/313 A |

FOREIGN PATENT DOCUMENTS

JP          11-284488        * 10/1999   ............ H03H/9/64

* cited by examiner

*Primary Examiner*—Robert Pascal
*Assistant Examiner*—Dean Takaoka
(74) *Attorney, Agent, or Firm*—Pamela Lan Kee

(57) ABSTRACT

In one embodiment, an N-stage ladder circuit is serially connected to a bridge (lattice circuit. The N-stage ladder circuit receives differential inputs, e.g. mixers, while the bridge lattice circuit outputs a singled end output, e.g. amplifier. In another embodiment, a bridge lattice circuit is serially connected to an N-stage ladder circuit. The bridge lattice circuit receives a single ended load while the N-stage ladder circuit provides a differential output. Film bulk acoustic resonators are used in the combination ladder and lattice structure for both embodiments to provide the necessary band-pass functionality as well as make the necessary transition from differential to single ended load.

6 Claims, 6 Drawing Sheets

INTEGRATED FILTER BALUN

FIELD OF THE INVENTION

The invention is directed towards the field of analog circuitry, particularly filters that manage the transition from differential to single-ended circuits.

BACKGROUND OF THE INVENTION

The prior art uses two schemes for high frequency analog electronics: single ended and differential. In single-ended designs, the signal is referenced to the ground plane. Any design, e.g. mixing, amplifying, or signal generation, may be performed by a single transistor. This makes the single ended architecture the better choice for discrete implementation. Unfortunately, single-ended implementations have a great sensitivity to the electrical connection to the ground plane. The sensitivity increases proportional to the increase in frequency or power. Compensating for this sensitivity at high power and frequency can require tens to hundreds of bond wires connecting the transistor to the ground plane. Any inductance in the ground plane itself can cause signal leakage between different parts of the larger circuit.

In differential designs, the signal is referenced to two orthogonal arms of the circuit. Any connection to the ground plane is parasitic, and of much less influence. The circuit is much more complex, however, requiring at least three transistors for each function. Thus, differential circuits are virtually always integrated. Another disadvantage is that some voltage is lost in extra biasing elements. However, the isolating nature of the differential is such a significant advantage that the loss of headroom and increased complexity is tolerable.

There are two types of differential structures: ladder and lattice. These filters are typically built using lumped resonators, e.g. crystal resonators, LC resonators, and combinations of the two. These filters tend to be quite large and expensive, hence, too costly for high volume consumer electronic applications, e.g. cellular phones. Recent developments in resonant structures allow these complex circuits to be built in a cost-effective manner.

Current implementations of film bulk acoustic resonators (FBAR) filters are half-ladder, single-ended structures, as shown in FIGS. 1A–B. The helper inductors, shown in FIG. 1B), move some of the rejection further into the reject bands to allow for broader frequency rejection. These helpers cause the rejection slope at the band edge to flatten, thereby reducing the rejection just out of band. The helpers also result in less rejection far out of band.

FIGS. 2A–F show embodiments of the prior art ladder circuits. FIG. 2A is a completely differential unrefererenced ladder section while FIG. 2B is a ladder section with a ground reference. The ground reference increases the filter complexity but has common mode rejection. They function similarly for differential operation. FIGS. 2C–D illustrate the filter response during differential operation. FIG. 2C shows the close-in or narrow-band filter response while FIG. 2D illustrates the broadband response. The filter has a very steep rejection followed by a very fast flyback response. FIG. 2E illustrates a ladder circuit using "helper" inductors. This is at the expense of increased complexity and cost. Similar to a half ladder circuit, the band edge rejection is worse. FIG. 2F shows a ladder section with two half ladder in parallel, helper inductors, and a ground reference. This is twice the expense. In each case, there is a very sharp transition from passband to reject band.

FIGS. 3A-3C illustrate the structure and the frequency response for a prior art lattice circuit. $F_A$ and $F_b$ refer to different resonant frequencies. Far out of band, the lattice has excellent rejection. However, the near band rejection is very slow. This makes the lattice unusable for circuits requiring close in rejection. This circuit has no fly back at all. Once beyond the passband, the rejection simply increases, at least to the level where other circuit parasitics dominate.

SUMMARY

In a first embodiment, an N-stage ladder circuit is serially connected to a bridge lattice circuit. The N-stage ladder circuit receives differential inputs, e.g. mixers, while the bridge lattice circuit outputs a singled end output, e.g. amplifier. In a second embodiment, a bridge lattice circuit is serially connected to an N-stage ladder circuit. The bridge lattice circuit receives a differential source while the N-stage ladder circuit drives a differential output load.

In either embodiment, it is preferable that a film bulk acoustic resonator (FBAR) be used in the combination ladder and lattice structure. This provides the necessary band-pass functionality and makes the transition from differential to single ended load where necessary.

DETAILED DESCRIPTION OF THE DRAWINGS

The present invention is a resonator-based filter that may be used in a differential circuit or when the circuit must both filter and convert from differential to single-ended. A ladder and lattice structure are combined into one filter to get the fast transition of the ladder with the far out of band rejection of the lattice, as shown in FIGS. 4A–4C.

An N-stage ladder circuit is serially connected to a bridge lattice circuit at nodes A and B. For each step of the ladder, the rails are a pair of FBARs at the first resonant frequency ($F_A$) and the rung is an FBAR at the second resonant frequency ($F_B$). The lattice circuit is a ring of alternating FBARs at $F_A$ and FBARs at $F_B$. The differential output is shown at nodes C and D.

Figure 1A:
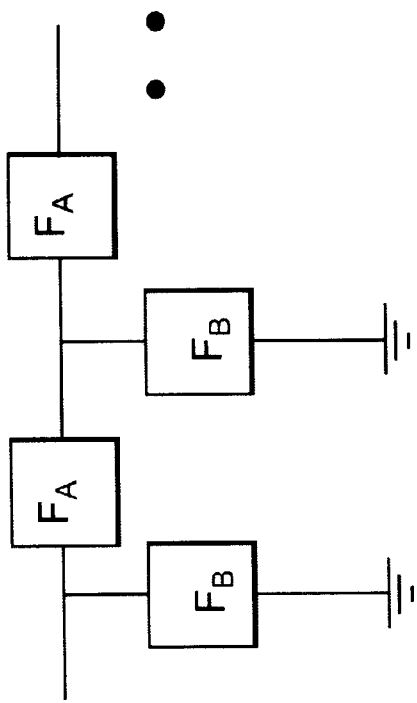
FIGS. 1A–B illustrate prior art film bulk acoustic resonator (FBAR) filters.
Figure 1B:
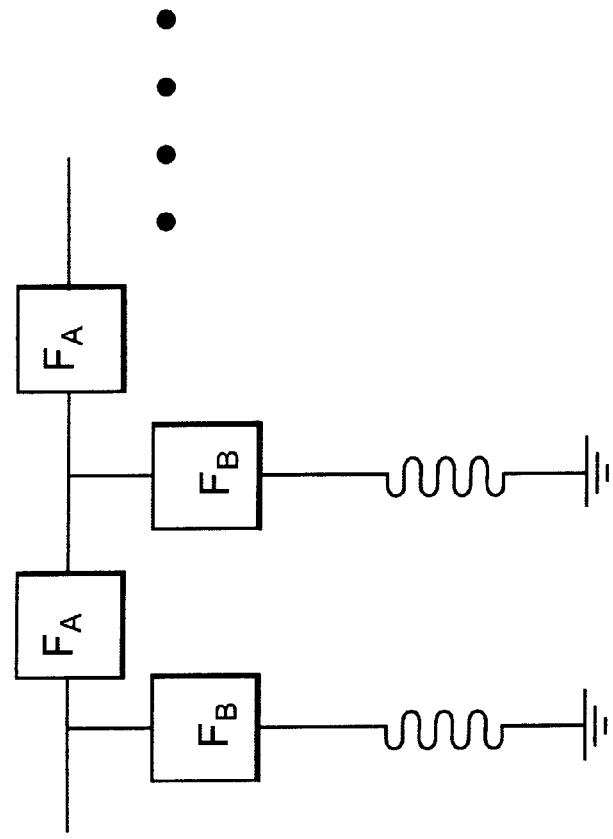
Figure 2C:
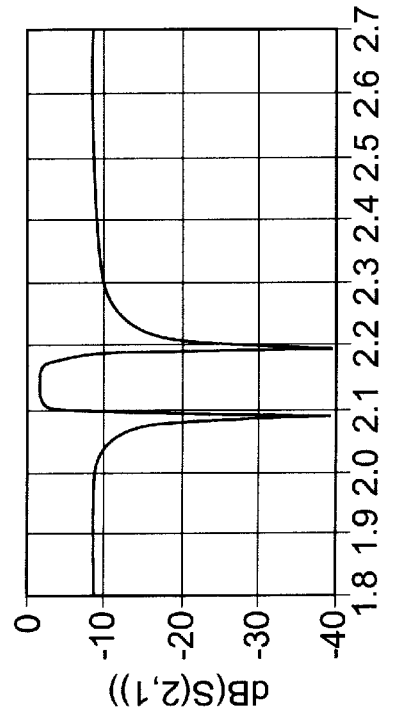
FIGS. 2A–F illustrate prior art ladder circuits.
Figure 2D:
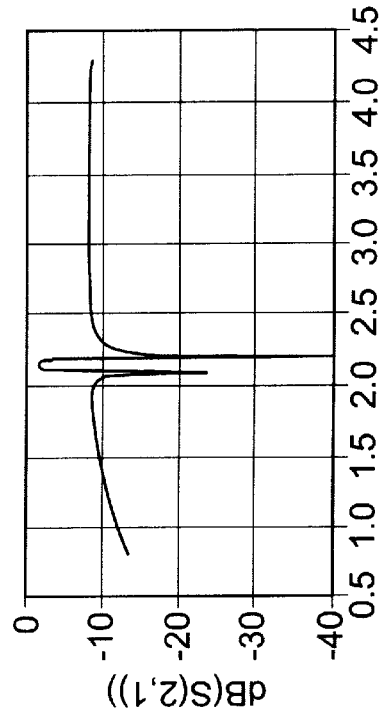
Figure 2A:
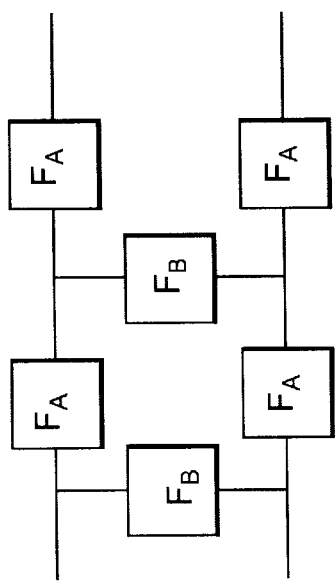
Figure 2B:
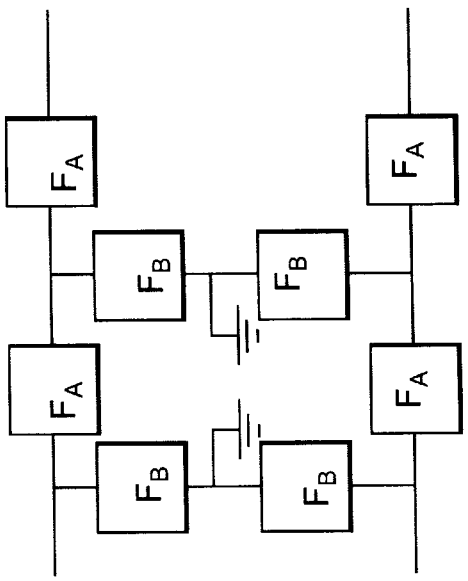
Figure 2F:
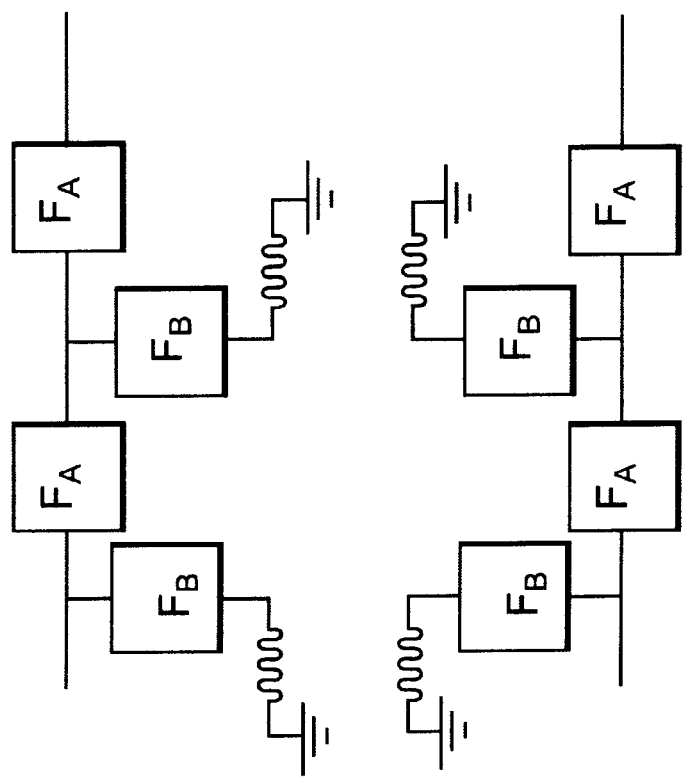
Figure 2E:
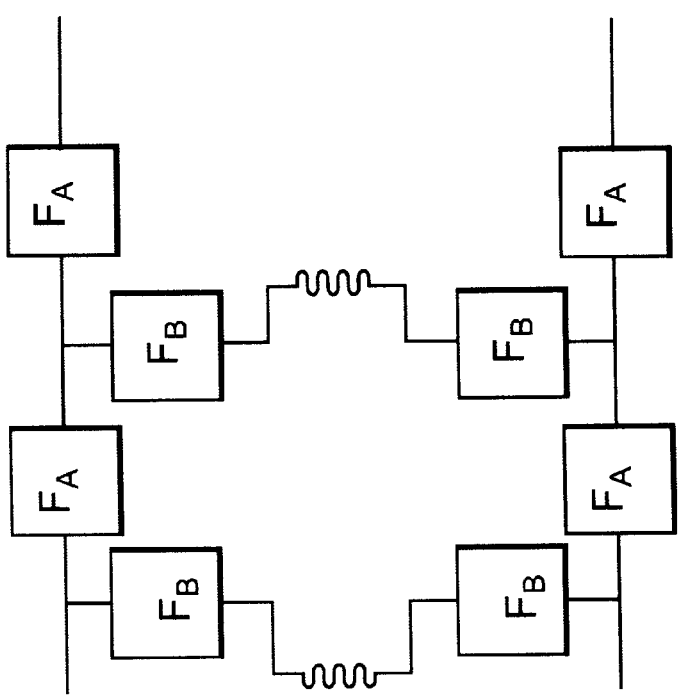
Figure 3B:
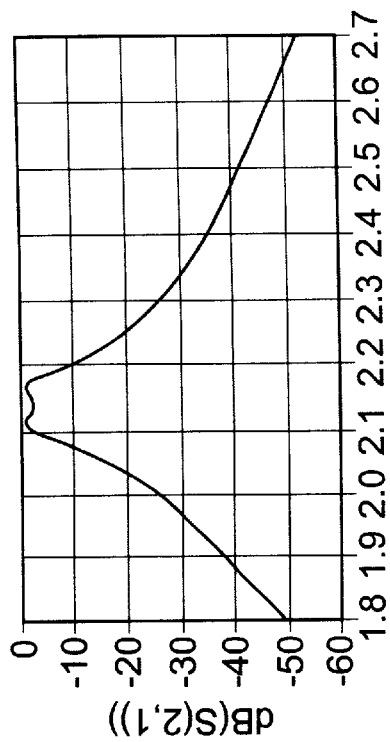
FIGS. 3B–3C illustrate the frequency response for the prior art lattice circuit.
Figure 3C:
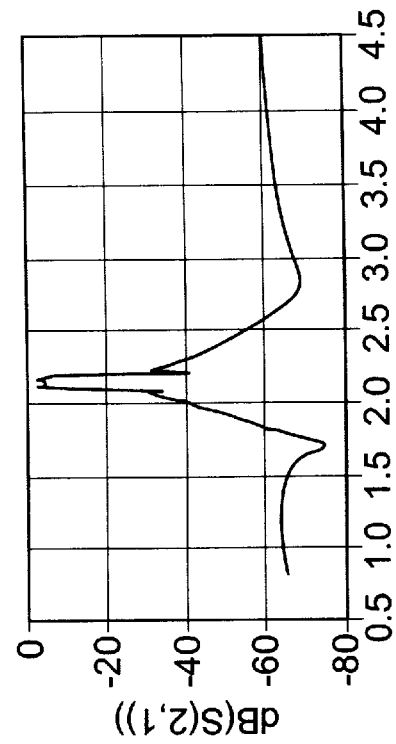
Figure 3A:
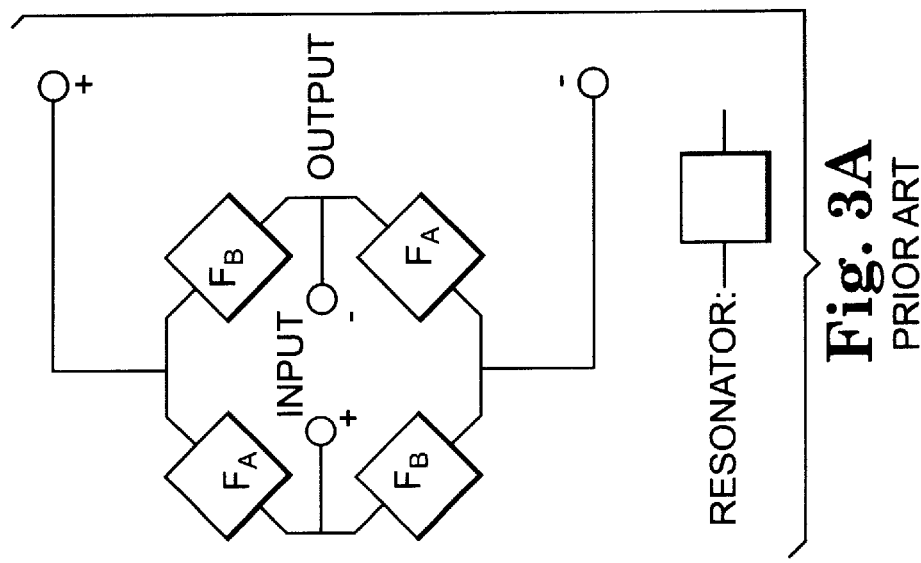
FIG. 3A illustrates a prior art lattice filter circuit.
Figure 4A:
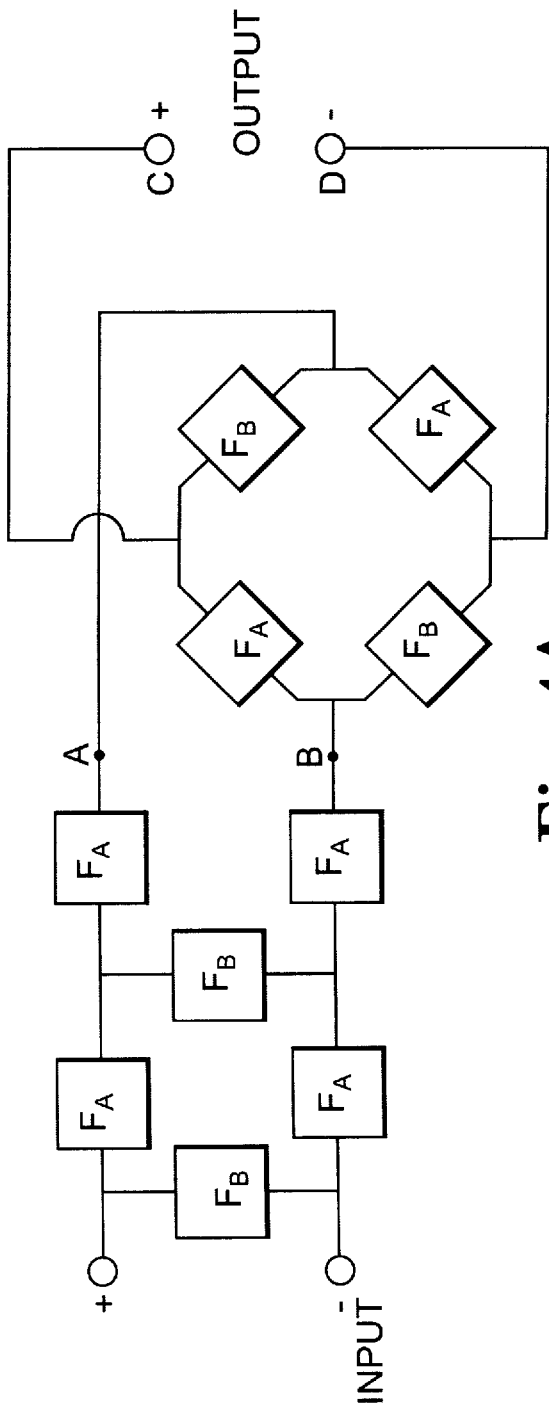
FIG. 4A illustrates a schematic diagram of the present invention.
Figure 4C:
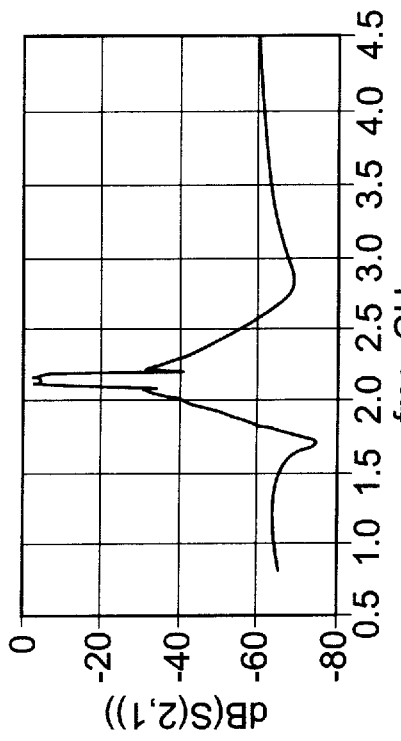
FIGS. 4B–4C illustrate the fast transition and far out band rejection of the combined ladder and lattice structure.
Figure 4B:
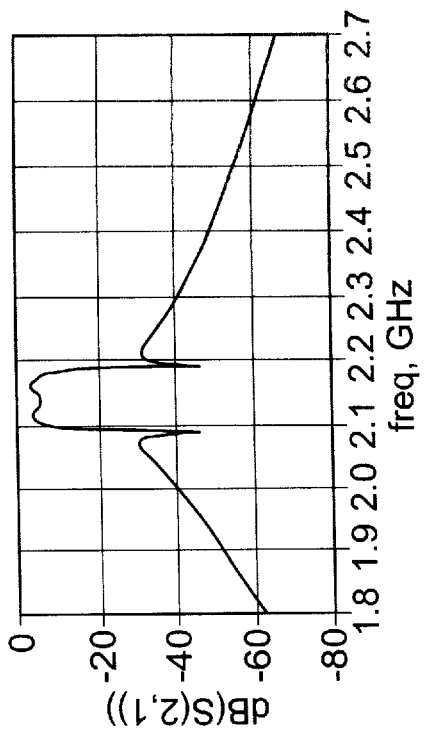
Figure 5A:
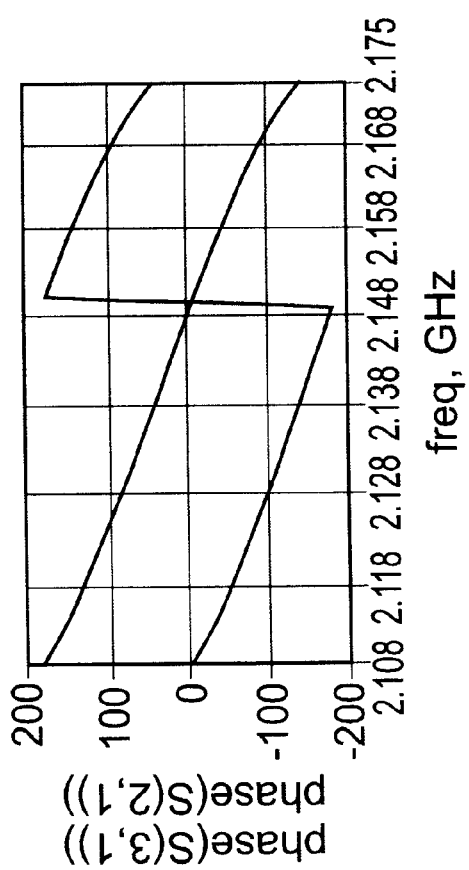
FIGS. 5A–5B illustrate the performance simulation for the circuit shown in FIG. 4A.
Figure 5B:
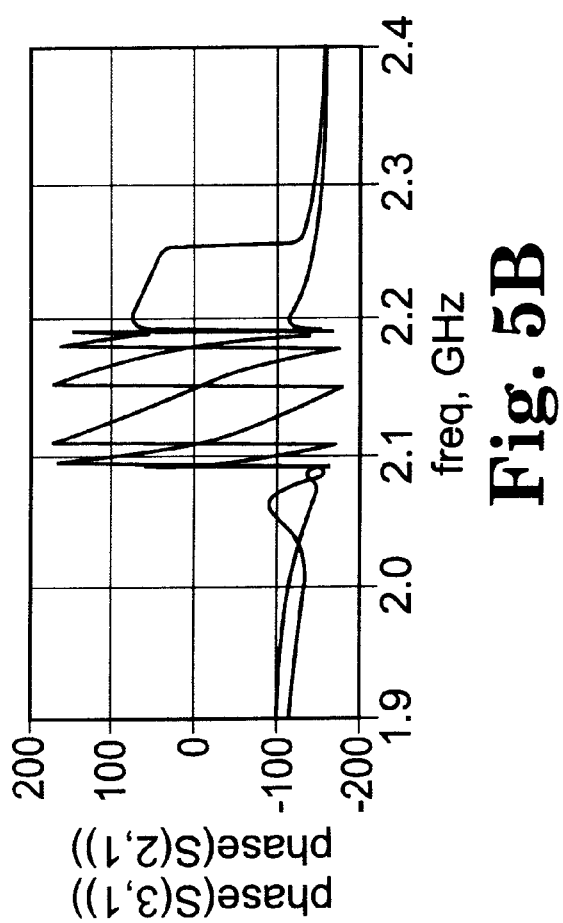

FIGS. 5A-5B illustrate a performance simulation for the circuit shown in FIG. 4A. FIG. 5A illustrates an in-band phase response of the ladder-lattice circuit with an unbalanced source. FIG. 5B illustrates a broadband response of the ladder-lattice circuit with an unbalanced source. The simulation shown assumes an ideal balance in the input circuit. In reality, there is some imbalance. In the present embodiment, an imbalance results in reduced differential rejection. In this unbalanced state, the filter puts the extra energy into the common mode.

This phenomenon is evident in the phase response of the filter. In the passband, each arm is 180° out of phase. When balanced, each arm is still 180° out of phase in the reject band. However, when unbalanced, two changes happen in the reject band. First, the amplitude attenuation is reduced, that is the rejection is less. Second, the phase shifts in the reject band until each arm is in phase. This in phase portion of the signal is the common mode and so would be rejected by the common mode rejection of the load.

The net rejection has two components. The first is the normal amplitude reduction of any filter. The second is a combination of how much of the reject signal is put into common mode, and how much common mode rejection is in the load. If the load has infinite CMRR, then the circuit is immune to source imbalance.

In current handsets, the antenna is single-ended. The base band analog portion of the radio is differential. A differential circuit is inherently less sensitive to interference, and thus allows for higher levels of integration. At some point in the transmit arm of the radio, there is transition from single ended to differential, or vice versa. This transition must be handled with minimum losses and expense. There are three techniques for dealing with this transition.

With the first technique, the differential nature of the load or source may be discounted. One of the two terminals can be grounded. This results in half the power being wasted. Far from the antenna, this can be a fine choice. However, when placed near the beginning of the receiver, this will cause an unacceptable increase in Noise Figure, decreasing sensitivity. Too far towards the end of the transmitter, and there will be an unacceptable waste of current and thus battery life.

Traditionally, this is remedied by the use of a balun (BALance/UNbalance). Use of a balun structure is the second technique. A balun is low-loss and may be placed anywhere in the radio. However, its bulk and expense limits its commercial viability. The third technique, a lumped equivalent balun (LE balun) has as few as three reactive elements, e.g. two inductors and a capacitor. This technique is very sensitive to component value and variation, and has proven largely unpractical.

Unlike the prior art, the present invention, a combination differential ladder and lattice filter, may be driven differentially into a single-ended load, without incurring a loss of half of the signal. The circuit is still sensitive to the balance of the source. Since a single-ended load is being driven, there is no common mode rejection. Consequently, as the source becomes more unbalanced, the filter rejection decreases. This filter requires more care to ensure that the source is sufficiently balanced to enable adequate rejection. Specifically, one may need to tune the individual arms of the differential source, balancing this source to ensure sufficient rejection.

We claim:

1. A circuit comprising:
    a N-stage differential ladder filter having at least two inputs and an output, and
    a bridge circuit, receiving the output of the N-stage differential ladder filter, having an output a bridge lattice circuit serially coupled to the differential ladder filter, comprising a plurality of resonators serially coupled together in a ring configuration at resonant frequencies alternating between a first and a second resonant frequency;
    wherein the N-stage differential ladder filter and the bridge circuit include film bulk acoustic resonators.

2. A circuit of claim 1, wherein a first stage of the differential ladder filter includes a first resonator at a first resonant frequency, the first resonator coupled between the at least two inputs.

3. A circuit of claim 2, wherein the first stage further comprises a second and a third resonator each at a second resonant frequency, the second resonator coupled to a first one of the at least two inputs and coupled in parallel with the first resonator, the third resonator coupled to a second one of the at least two inputs and coupled in parallel with the fist resonator.

4. A circuit of claim 3, wherein subsequent stages of the differential ladder filter are configured substantially the same as the first stage.

5. A filter comprising:
    a differential ladder filter having a plurality of stages and having two inputs and two outputs, each stage including two rail sections and one rung section, each rail section including a resonator at a first resonant frequency, each rung section including a resonator at a second resonant frequency; and
    a bridge lattice circuit serially coupled to the differential ladder filter, the bridge lattice circuit comprising a plurality of resonators serially coupled together in a ring configuration at resonant frequencies alternating between the first and the second resonant frequency.

6. The filter of claim 5, wherein the resonators in the differential ladder filter and the bridge lattice circuit are film bulk acoustic resonators.

* * * * *